US011923458B2

(12) United States Patent
Ando et al.

(10) Patent No.: US 11,923,458 B2
(45) Date of Patent: Mar. 5, 2024

(54) FEFET WITH DOUBLE GATE STRUCTURE

(71) Applicant: International Business Machines Corporation, Armonk, NY (US)

(72) Inventors: Takashi Ando, Eastchester, NY (US); Guy M. Cohen, Ossining, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 17/336,534

(22) Filed: Jun. 2, 2021

(65) Prior Publication Data
US 2022/0393031 A1 Dec. 8, 2022

(51) Int. Cl.
*H01L 29/78* (2006.01)
*H01L 29/66* (2006.01)

(52) U.S. Cl.
CPC ...... *H01L 29/7855* (2013.01); *H01L 29/6684* (2013.01); *H01L 29/66484* (2013.01); *H01L 29/66795* (2013.01); *H01L 29/78391* (2014.09)

(58) Field of Classification Search
CPC ........... H01L 29/7855; H01L 29/66484; H01L 29/6684; H01L 29/78391; H01L 27/11585–11597; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365
See application file for complete search history.

(56) References Cited

U.S. PATENT DOCUMENTS

| | | | |
|---|---|---|---|
| 9,685,215 B1 * | 6/2017 | Kang | G11C 11/223 |
| 10,038,092 B1 | 7/2018 | Chen | |
| 10,056,376 B2 | 8/2018 | Flachowsky | |
| 10,424,379 B2 | 9/2019 | Slesazeck | |

(Continued)

OTHER PUBLICATIONS

Burr et al., "Experimental Demonstration and Tolerancing of a Large-Scale Neural Network (165 000 Synapses) Using Phase-Change Memory as the Synaptic Weight Element", in IEEE Transactions on Electron Devices, vol. 62, No. 11, Nov. 2015, pp. 3498-3507.

(Continued)

*Primary Examiner* — Mohammad A Rahman
(74) *Attorney, Agent, or Firm* — Monchai Chuaychoo

(57) ABSTRACT

An approach for representing both positive and negative weights in neuromorphic computing is disclosed. The approach leverages a double gate FeFET (ferroelectric field effect transistor) device. The device leverages a double-gate FeFET with four terminals (two separate gates and source and drain) and ferroelectric gate dielectric. The device may have a junction-less channel. A synaptic weight is programmed by biasing one of the two gates. The store weight is sensed via a current flow from source to drain. A pre-defined bias is applied to the other gate during the sensing, such that a reference current is subtracted from the drain current. The net current for sensing is current from the synaptic devices subtracted by the pre-defined reference current.

9 Claims, 6 Drawing Sheets

TOP VIEW

3D VIEW

(56) References Cited

U.S. PATENT DOCUMENTS

| | | | |
|---|---|---|---|
| 2007/0048934 A1* | 3/2007 | Kim | H01L 29/66795 |
| | | | 257/E21.654 |
| 2007/0127862 A1* | 6/2007 | Mitomi | G02F 1/035 |
| | | | 385/8 |
| 2019/0012593 A1 | 1/2019 | Obradovic | |
| 2019/0273087 A1 | 9/2019 | Morris | |
| 2019/0386014 A1 | 12/2019 | Doyle | |
| 2020/0065647 A1 | 2/2020 | Mulaosmanovic | |
| 2020/0105940 A1 | 4/2020 | Majhi | |
| 2020/0227515 A1* | 7/2020 | Shifren | H01L 28/40 |
| 2021/0034953 A1 | 2/2021 | Pesic | |
| 2021/0375937 A1* | 12/2021 | Wu | H10B 51/10 |
| 2022/0140148 A1* | 5/2022 | Nam | H01L 29/516 |
| | | | 257/295 |

OTHER PUBLICATIONS

Colinge et al., "Nanowire transistors without junctions", Nature Nanotechnology, Published Online: Feb. 21, 2010, Doi: 10.1038/NNANO.2010.15, 5 pages.

Dunkel et al., "A FeFET based super-low-power ultra-fast embedded NVM technology for 22nm FDSOI and beyond", EDM17-485, 2017, pp. 19.7.1-19.7.4.

Jerry et al., "Ferroelectric FET Analog Synapse for Acceleration of Deep Neural Network Training", 2017 IEEE International Electron Devices Meeting (IEDM), San Francisco, CA, USA, 2017, pp. 6.2.1-6.2.4.

Kawasaki et al., "Demonstration of Highly Scaled FinFET SRAM Cells with High-K/Metal Gate and Investigation of Characteristic Variability for the 32 nm node and beyond", 2008 IEEE International Electron Devices Meeting, San Francisco, CA, USA, 2008, 4 pages.

Liu et al., "A Highly Threshold Voltage-Controllable 4T FinFET with an 8.5-nm-Thick Si-Fin Channel", IEEE Electron Device Letters, vol. 25, No. 7, Jul. 2004, pp. 510-512.

Reddy et al., "Quasi-Static Terminal-Charge Model for Symmetric Double-Gate Ferroelectric FETs," in IEEE Transactions on Electron Devices, vol. 63, No. 3, Mar. 2016, pp. 940-945.

\* cited by examiner

TOP VIEW

NEW STRUCTURE

FEFET WITH DOUBLE GATE STRUCTURE

BACKGROUND

The present invention relates generally semiconductor devices, and more particularly to FeFET (ferroelectric field effect transistor).

A field-effect transistor (FET) is a semiconductor device that includes a gate, a source and a drain. A FET uses an electric field applied by the gate to control the electrical conductivity of a channel through which charge carriers (e.g., electrons or holes) flow from the source to the drain. A FeFET uses a FET that includes ferroelectric materials (e.g., hafnium zirconium oxide, silicon- or aluminum-doped hafnium oxide etc.) positioned between the gate and source-drain region. FeFET devices has been used as non-volatile memory in computer system.

Furthermore, a FinFET device consists a multi-gate device and is considered a type of non-planar transistor. The "fin" from name of FinFET is based on the structure of the protruding region/channel (i.e., shaped like a "fin") between the source and drain.

SUMMARY

Aspects of the present invention disclose a device, computer-implemented method, a computer system and computer program product for representing both positive and negative weights in neuromorphic computing. The device may include one or more fins are disposed on a FET (field effect transistor) semiconductor device; a first fin of the one or more fins comprises of a first ferroelectric layer and first interfacial layer, respectively; a second fin of the one or more fins comprises of a second ferroelectric layer and second interfacial layer, respectively; the first fin of the one or more fins contains a first gate and the second fin of the one or more fins contains a second gate; a drain current region is disposed between the second interfacial layer and the first interfacial layer; and the drain current region has a source gate coupled to a drain gate.

The computer implemented method may be implemented by one or more computer processors and may include forming one or more fins on a substrate; forming one or more interfacial layer; forming one or more ferroelectric dielectric layers; depositing metal onto one or more gates; polishing the one or more fins and the one or more gates; patterning the one or more gates; and etching the one or more gates.

According to another embodiment of the present invention, there is provided a computer system. The computer system comprises a processing unit; and a memory coupled to the processing unit and storing instructions thereon. The instructions, when executed by the processing unit, perform acts of the method according to the embodiment of the present invention.

According to a yet further embodiment of the present invention, there is provided a computer program product being tangibly stored on a non-transient machine-readable medium and comprising machine-executable instructions. The instructions, when executed on a device, cause the device to perform acts of the method according to the embodiment of the present invention.

BRIEF DESCRIPTION OF THE DRAWINGS

Preferred embodiments of the present invention will now be described, by way of example only, with reference to the following drawings, in which.

DETAILED DESCRIPTION

In the current state of art of neuromorphic computing, memory devices such as Ferroelectric FET (FeFET), phase change memory (PCM), and resistive random access memory (ReRAM), are used to mimic electronic synapse and/or neuro-biological architecture in the nervous system. In neuromorphic computing applications, a resistive memory device can be used as a connection (synapse) between a pre-neuron and post-neuron, representing the connection weight in the form of device conductance. However, it is not possible to represent both positive and negative weights with a single device conductance. Therefore, differential read of pair devices or subtraction of reference current by FET devices is often used to address this issue. Additionally, the approach comes with the cost of additional NVM (non-volatile memory) devices and periphery circuits for the differential read.

Embodiments of the present invention recognizes the deficiencies in the current state of art and provides an approach for addressing the deficiencies. One approach leverages a double-gate FinFET with four terminals (two separate gates and source and drain) and ferroelectric gate dielectric. This allows for one single device (instead of two or more devices) to have a positive and negative weights. By using one device, there is a significant reduction in unit cell size and periphery circuits for deep learning application.

In other embodiments, the double gate device has a separate contact between the two gates unlike a common gate that is typically used in a FinFET structure. Other structural features of the embodiment includes, but it is not limited to, the following: (1) the gate insulator that is ferroelectric, (ii) IL/ferroelectric layers on both sides of the Fin do not have to be symmetric and (iii) the device does not have to use periphery circuits for a reference subtraction.

Figure 3:
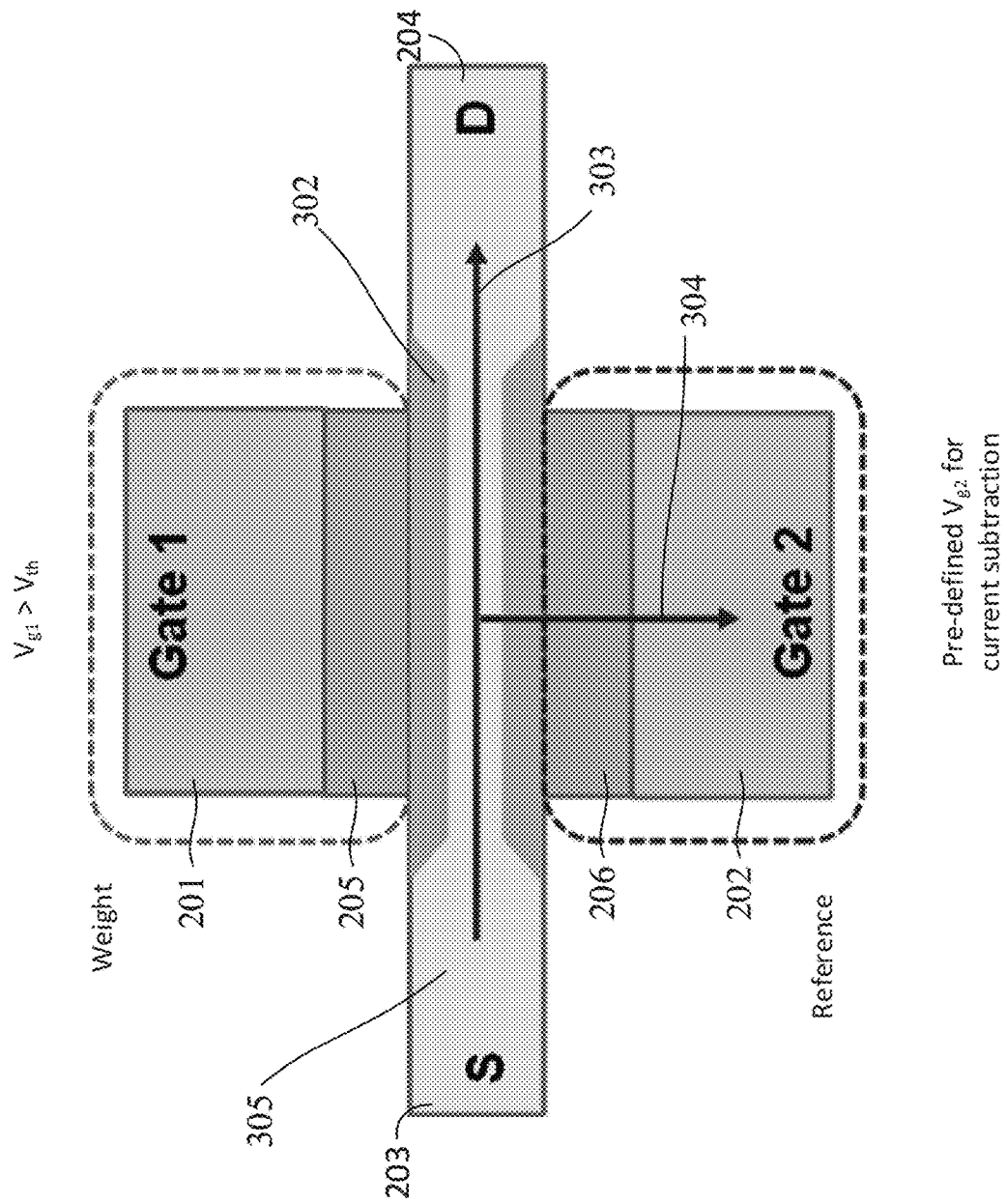
FIG. 3 is a depiction of a junction-less channel version of double-gate FinFET 102, in accordance with another embodiment of the present invention.

In another embodiment, the source and drain (channel) can be a junction-less channel (see FIG. 3).

Other features of the present invention may offer advantages and/or potential areas of improvement with respect to the current state of the art: (i) most industry standard utilize a tri-gate design. Thus, the double-gate FinFET with separate two gate contacts in conjunction with ferroelectric dielectric requires intentional effort of deviating from the standard technology; (ii) using one side of FeFET as a synaptic device and the other side of FeFET for reference current subtraction is not a conventional way of using this device and previously unreported; (iii) other double-gate FETs are not used as memory devices and do not have asymmetric oxide; (iv) double-gate structure in conjunction with a junction-less transistor allows for reference current subtraction from a common current path.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

It should be understood that the Figures are merely schematic and are not drawn to scale. It should also be understood that the same reference numerals are used throughout the Figures to indicate the same or similar parts.

Figure 1A:
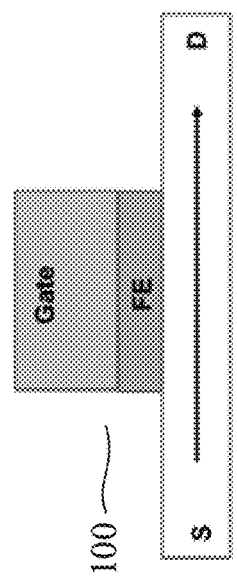
FIG. 1A is a depiction of the current state of technology related FeFET (Ferroelectric Field-Effect Transistor), in accordance with an embodiment of the present invention.

FIG. 1A is a depiction of the current state of technology, device 100, related FeFET (Ferroelectric Field-Effect Transistor), in accordance with an embodiment of the present invention. Device 100 is a planar FeFET device.

Figure 1B:
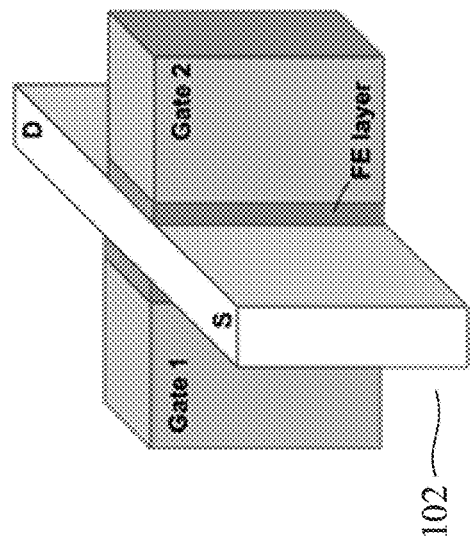
FIG. 1B is a depiction of a double-gate FinFET (fin field-effect transistor), an improvement to the prior art, designated as 102, in accordance with an embodiment of the present invention.

FIG. 1B is a depiction of a double-gate FinFET (fin field-effect transistor), an improvement to the prior art, designated as double-gate FinFET 102, in accordance with an embodiment of the present invention. Double-gate FinFET 102 will be described in detail in FIG. 2.

Figure 2A:
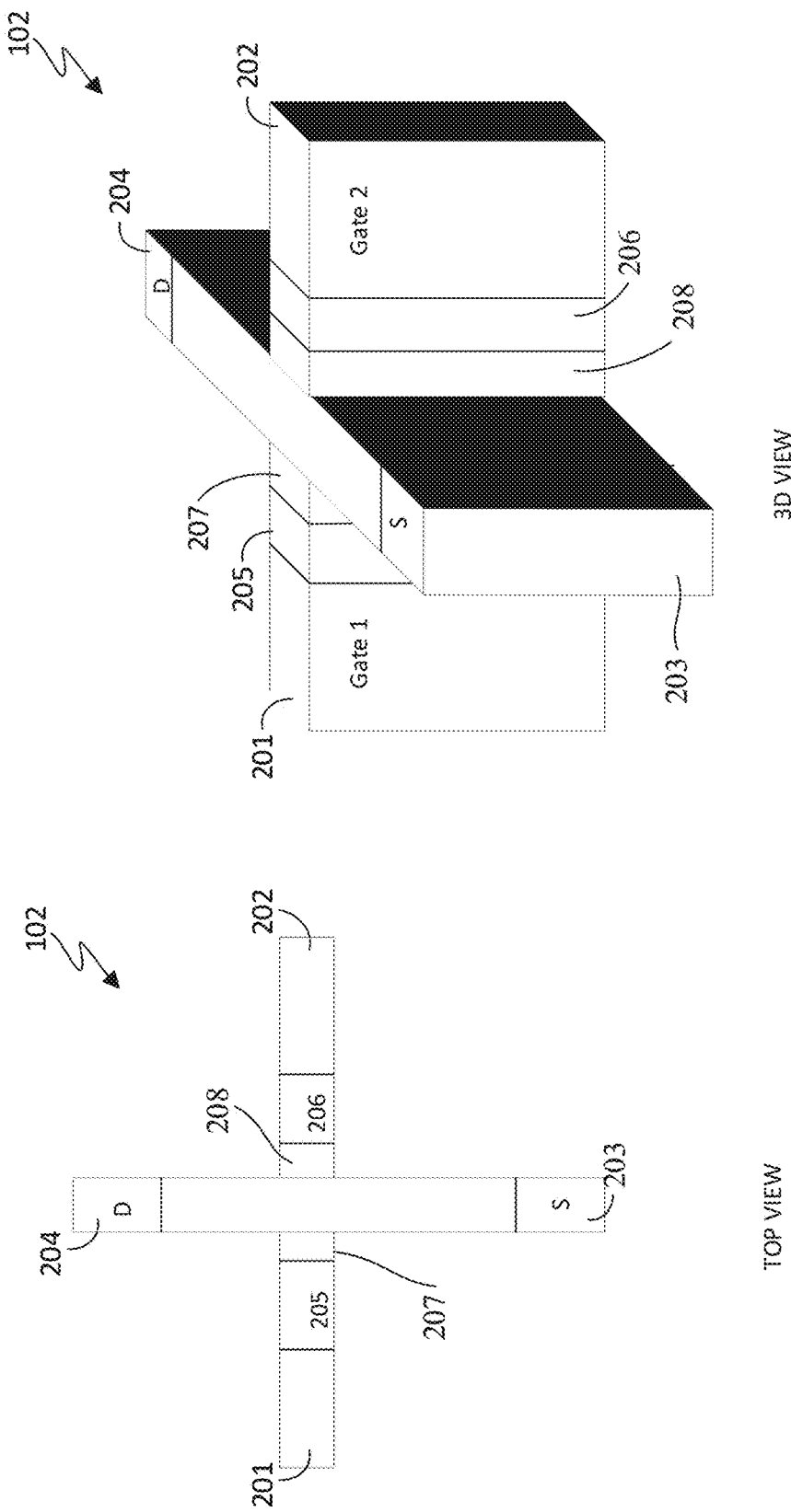
FIG. 2A is a detailed view (top view and 3D view) of double-gate FinFET 102, in accordance with an embodiment of the present invention.

FIG. 2A is a detailed view of the double-gate FinFET 102, in accordance with an embodiment of the present invention.

Structural Features

The first gate (referring to FIG. 2A) is designated as gate1 201. The second gate is designated as gate2 202. The ferroelectric layer between the two gates are designated as FeL1 205 and FeL2 206. The source is designated as source 203 and the drain is designated as drain 204. The interfacial layers are designated as IL1 207 and IL2 208.

The general structural features includes: (i) double-gate FinFET with 4 terminals (two gates, source, drain), (ii) ferroelectric layer as a gate dielectric (e.g., FeL1 205 and FeL2 206), (iii) interfacial layer thickness on one side of Fin is different from the other (e.g., IL1 207 and IL2 208) and (iv) ferroelectric layer on one side of Fin includes defects contributing to leakage current.

Referring to FeL1 205 and FeL2 206, both of these ferroelectric layers have the same thickness. The typical thickness range for FeL1 205 and FeL2 206 is 2-10 nm. However, there are "defects" introduced to the ferroelectric layer on one side of a Fin that allows for higher leakage current (see leakage 304 of FIG. 3). Defects can include carbon and various metal cations (e.g. Al, Ag, Cu etc.). However, in the best embodiment, oxygen vacancies would be the preferred defects for the ferroelectric layer.

Referring to IL1 207 and IL2 208 are interfacial layers between the "fin" and FeL1 205 and FeL2 206, respectively. Interfacial layers can be of an oxide layer of the fin material. In the current embodiment, IL1 207 and IL2 208 are composed of $SiO_2$. The interfacial layers (on each side of the fin) will have varying thickness and will not be symmetrical. A typical thickness for the interfacial layers is between 0.5 nm to 1.5 nm. For example, IL1 207 can have a higher thickness than IL2 208 typically by 0.5 nm to 1.0 nm, but not limited to this range.

Other features includes: (i) tilted ion implantation is used to change the interfacial layer thickness on one side of the fin to the other and (ii) tilted ion implantation is used to introduce defects in the ferroelectric layer on one side of the fin.

In an alternative embodiment, the double gate device can utilize junction-less channels (i.e., one continuous source and drain). This junction less channel will be described in more details in FIG. 3. A junction-less channel would be the best and preferred embodiment of the present invention.

Process Features

Based on a double-gate FinFET, embodiment of the present invention, the method of use will be described below (see FIG. 2B). One side of the double-gate FinFET (i.e., gate1 201) is used as FeFET to tune the channel conductance in an analog fashion. The other side of the double-gate FinFET (i.e., gate2 202) is used as reference device to subtract a pre-defined current via gate leakage current. The drain current of FeFET (i.e., arrow 220) minus gate current of reference (i.e., arrow 221) is detected during sensing.

In summary, the process involves, (i) programing a synaptic weight by biasing the gate (i.e., gate1 201), (ii) the stored weight is senses via a current flow from source to drain (i.e., arrow 220), (iii) a pre-defined bias is applied to the other gate (i.e., gate2 202) during sensing, such that a reference current (i.e., arrow 221) is subtracted from the drain current. Thus, the net current for sensing is the current from the synaptic device subtracted by the pre-defined reference current. By enabling the representation of both positive and negative weights with one synaptic device (i.e., double-gate FinFET 102), there is no need to use differential read by a periphery circuit.

Alternatively, based on a double-gate FinFET with a junction-less channel, another embodiment of the present invention, the method of use will be described in more details with respect to FIG. 3.

Manufacturing Features

The method of manufacture of FinFET devices can leverage existing method known in the art. For example, this may include the following known steps: (1) starting with a doped substrate with a hard mask on top (silicon nitride) as well as a patterned resist layer, (2) etching the fins (via anisotropic etch process), (3) oxide deposition (to isolate fins), (4) planarization of the oxide by CMP (chemical mechanical polishing), (5) recess the oxide film by an etch process, (6) depositing a gate oxide on top of the fins and (7) depositing a gate electrode (e.g. metal or doped poly silicon layer) on top of the gate oxide.

Figure 4:
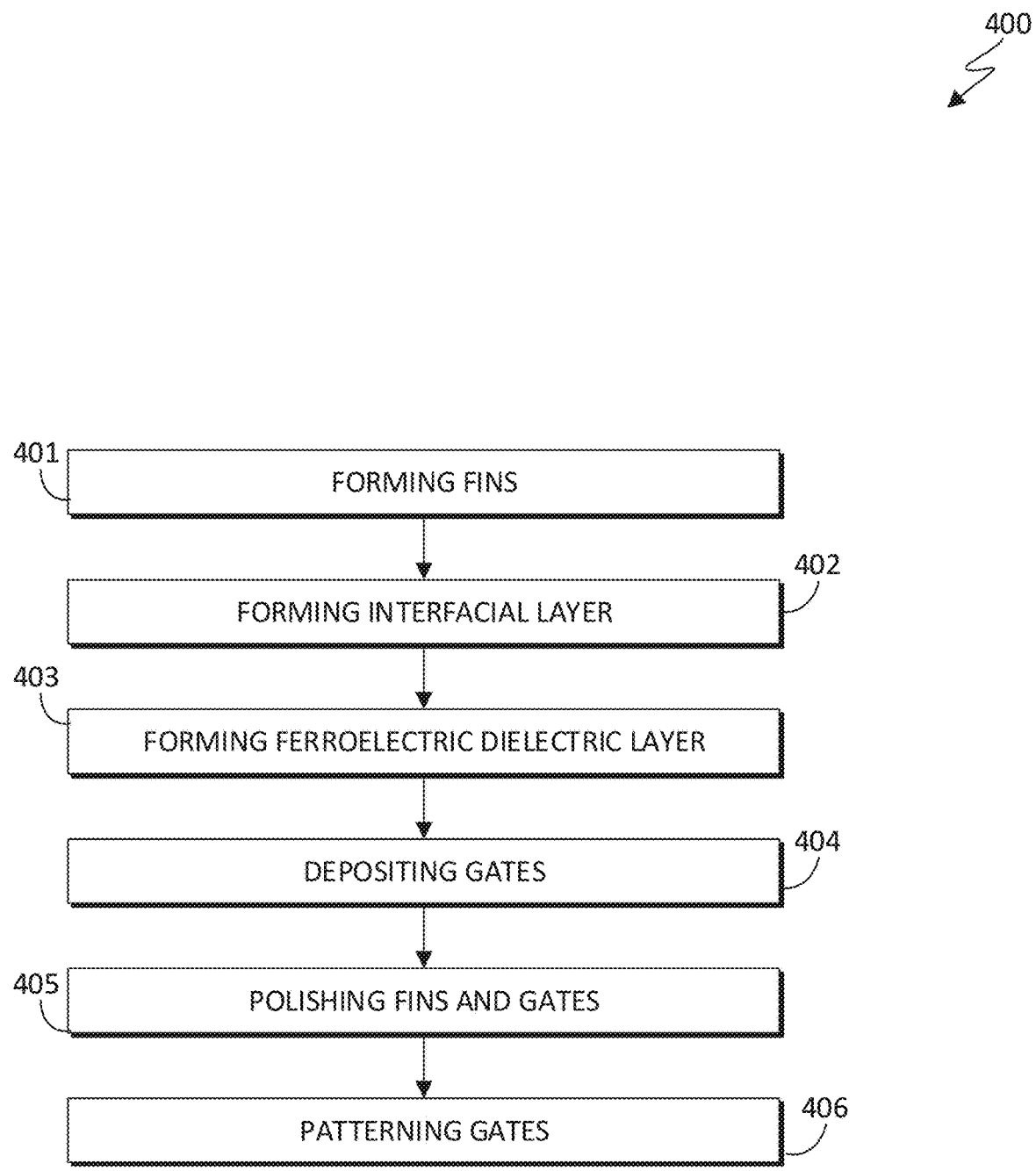
FIG. 4 is a flowchart illustrating a process of forming double-gate FinFET 102, designated as process 400, in accordance with an embodiment of the present invention.

With respect to an embodiment of the present invention, a manufacturing process, designated as process 400, may include the following steps (see FIG. 4): (i) forming fin (step 401), (ii) forming interfacial layer (step 402), (iii) forming ferroelectric dielectric layer (step 403), (iv) depositing gate metal (step 404), (v) polishing FIN and gates (step 405), (vi) patterning gates (step 406) and (optional step vii) etching to define gates. It is noted that the Fin channels can be highly doped (i.e., greater than 1 E19 $cm^{-3}$) to avoid the impact from the other gate on the potential profile in the channel region. Furthermore, it is possible to make that gate without etching (for example by making a trench deposit the gate metal and then polish to remove the excess metal over the fin, thus breaking the gate metal into two separate gates.

In another embodiment, an optional step (option 1) to process 400 may include a step to control IL thickness by using tilted ion implantation. This step can occur after step 401 of process 400 and before step 402.

Similarly, in another embodiment, another optional step (option 2) to process 400 may include a step to introduce defects to the ferroelectric and interfacial layers by utilizing titled ion implantation. This step can occur after step 403 of process 400 and before step 404.

Regarding step 401, forming fin(s) can use any existing method in the art of creating FinFET. Regarding step 402, forming interfacial layers can use any existing method in the art of creating FinFET. Regarding step 403, forming ferroelectric dielectric layer may include using doped $HfO_2$. Amorphous $HfO_2$ is a paraelectric material and in order to turn it into a ferroelectric, there is a need to stabilize the orthorhombic phase and this typically requires doping (e.g. Zr, Si, Al, etc.), followed by an anneal process for crystallization. An annealing process is performed as part of step 403, wherein entire Si wafer, including parts under the doped $HfO_2$ are also heated.

Regarding step 404, depositing gate metal can use any existing method in the art of creating FinFET. Regarding step 405, polishing fins and gates can use any existing method in the art of creating FinFET (i.e. Chemical Mechanical Polishing). Regarding step 406, patterning gates can use any existing method in the art of creating FinFET.

With respect to another embodiment of the present invention, another manufacturing process may include the following steps: (i) fin formation, ii) interfacial layer formation, (iii) doped $HfO_2$ deposition, (iv) crystallization anneal, (v) tilted ion implantation to introduce defects, (viii) gate metal deposition, (vii) CMP to expose the top FIN and to isolate two sides of gate, (vii) gate patterning step and (ix) RIE (reactive ion etching) to define gate.

FIG. 3 is an explanation of junction-less double gate FinFET, in accordance with another embodiment of the present invention.

As previously mentioned, the best embodiment of the present invention involves a junction-less double-gate FinFET device. In order to subtract a reference current, a common current path is needed for the double-gate structure. Conventional inversion-mode FET will have two separate inversion layers, so the current subtraction methodology would not work. This potential issue can be resolved (ensure current subtraction from a common current path) by utilizing a junction-less channel.

Manufacturing Features

Typically, a junction less channel can be formed by heavily doping the channel (1 E19 $cm^{-3}$). A conduction path is at middle of the Fin instead of being confined to an inversion layer at the Fin surface. The junction-less channel can be created in any FET structure (e.g., Planar, FIN, nanosheet, etc.).

Structural Features

However, in the current embodiment, (referring to FIG. 3), the structural feature can include the following: (i) the channel material (i.e., doped area 305) is doped in one type (n-type or p-type) with a high doping concentration (1 E19 $cm^{-3}$ or higher); (ii) depletion layer 302 forms a part of the junction-less channel and located at the surface of fin; (iii) drain arrow 303 illustrate the path of the drain current (from source to drain); and (iv) leakage 304 illustrates the path of the leakage current (from the gate due to defects, etc.).

Process Features

Figure 2B:
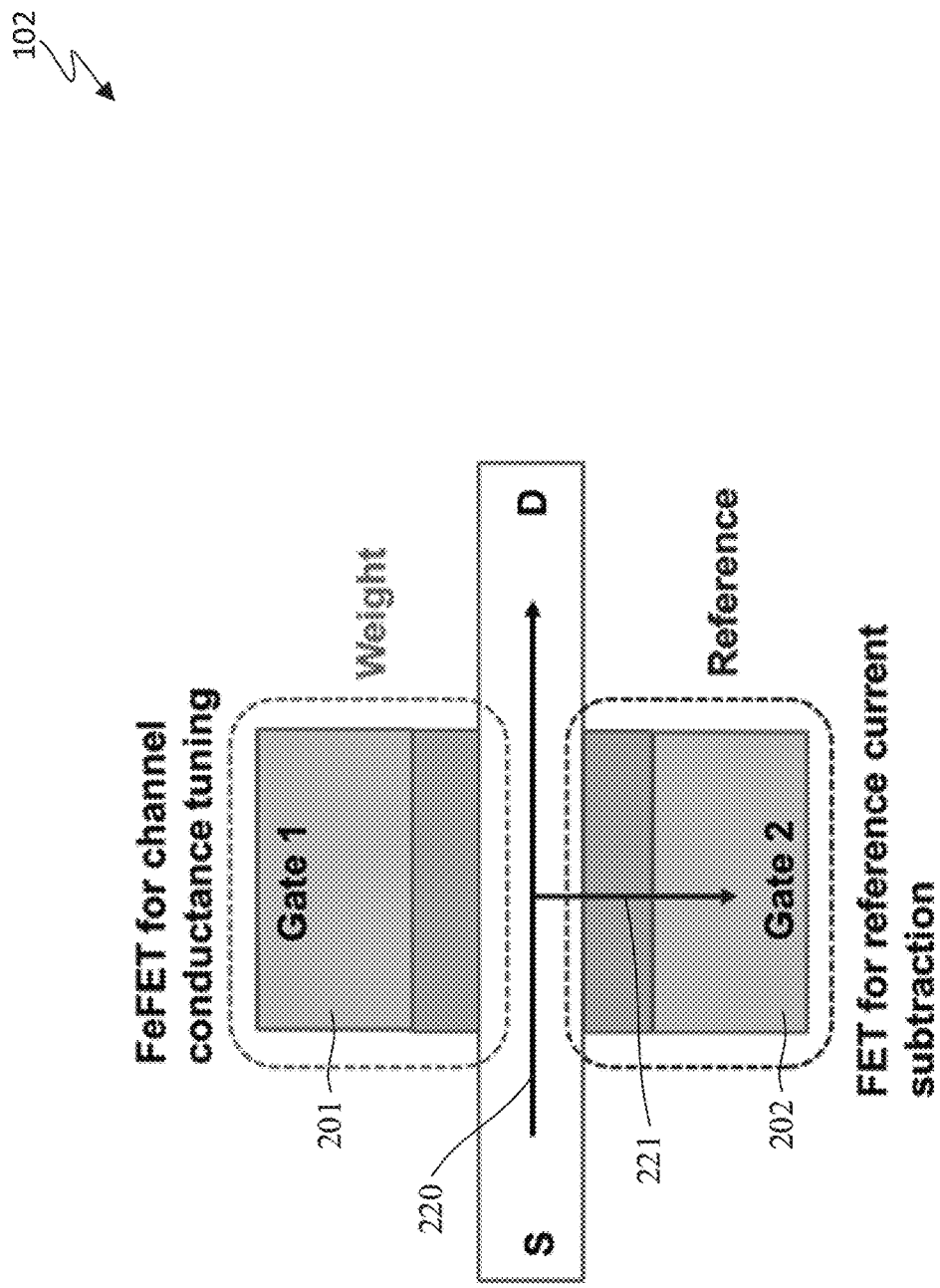
FIG. 2B illustrates the method of use for double-gate FinFET 102, in accordance with an embodiment of the present invention.

The method of use of the junction less double-gate FinFET is similar to the methodology recited in FIG. 2B for a double-gate FinFET. Some highlighted features for a junction less double-gate is listed as, (i) linear region of FET1 is used for sensing (Gate 1 bias: Vg1>Vth), (ii) pre-defined Vg2 is applied to Gate2 to subtract a reference current. Since linear region of FET1 is used, this current is low (<10 uA) and there is no reliability concern for FET2 (i.e., gate 2) and (iii) the reference current is subtracted from the common current flow at the middle of the fin.

Figure 5:
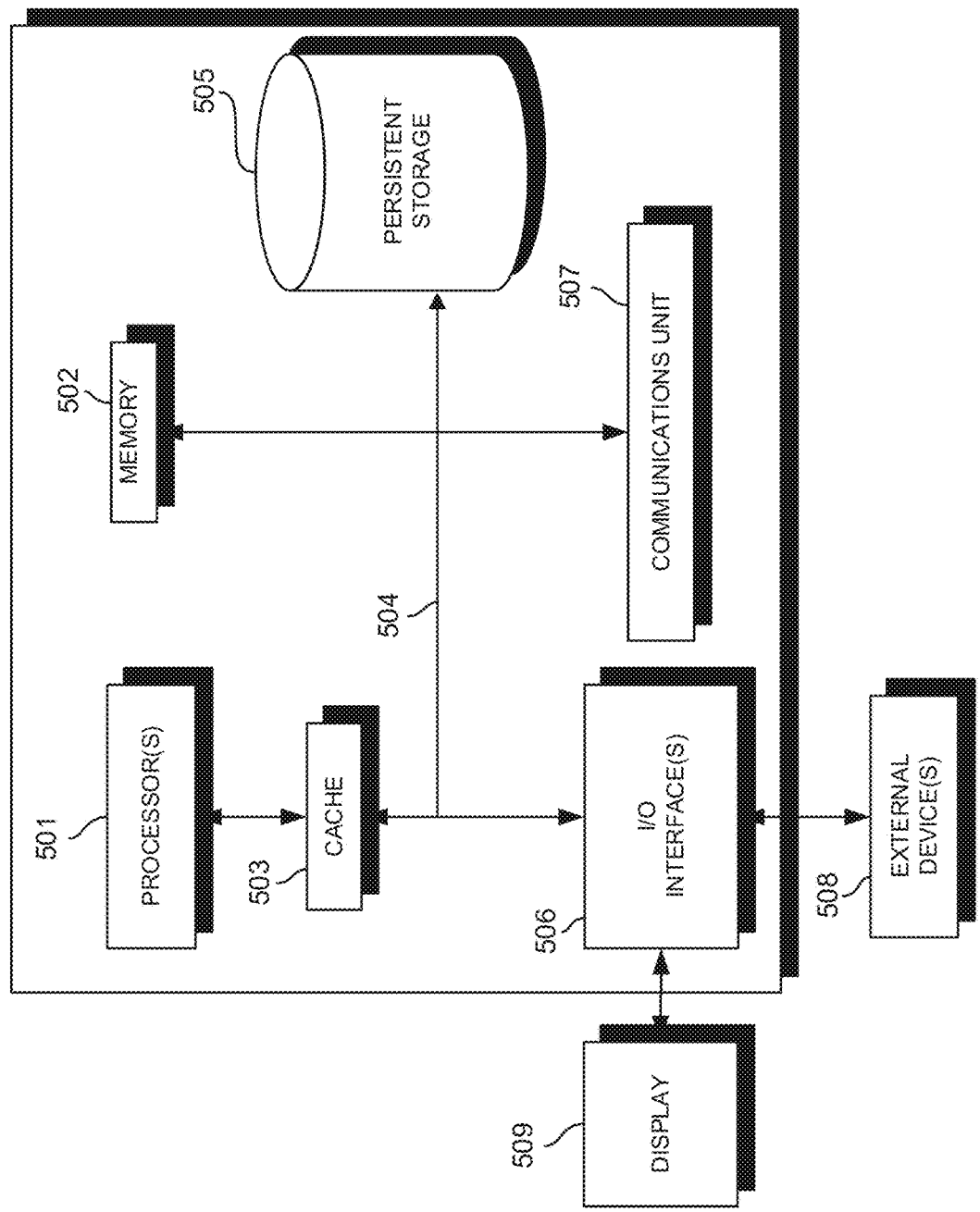
FIG. 5 depicts a block diagram, designated as 500, of components of a server computer capable of executing process 400 (of FIG. 4), in accordance with an embodiment of the present invention.

FIG. 5, designated as 500, depicts a block diagram of components of a computer system executing process 400, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

FIG. 5 includes processor(s) 501, cache 503, memory 502, persistent storage 505, communications unit 507, input/output (I/O) interface(s) 506, and communications fabric 504. Communications fabric 504 provides communications between cache 503, memory 502, persistent storage 505, communications unit 507, and input/output (I/O) interface(s) 506. Communications fabric 504 can be implemented with any architecture designed for passing data and/or control information between processors (such as microprocessors, communications and network processors, etc.), system memory, peripheral devices, and any other hardware components within a system. For example, communications fabric 504 can be implemented with one or more buses or a crossbar switch.

Memory 502 and persistent storage 505 are computer readable storage media. In this embodiment, memory 502 includes random access memory (RAM). In general, memory 502 can include any suitable volatile or non-volatile computer readable storage media. Cache 503 is a fast memory that enhances the performance of processor(s) 501 by holding recently accessed data, and data near recently accessed data, from memory 502.

Program instructions and data (e.g., software and data x10) used to practice embodiments of the present invention may be stored in persistent storage 505 and in memory 502 for execution by one or more of the respective processor(s) 501 via cache 503. In an embodiment, persistent storage 505 includes a magnetic hard disk drive. Alternatively, or in addition to a magnetic hard disk drive, persistent storage 505 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 505 may also be removable. For example, a removable hard drive may be used for persistent storage 505. Other examples include optical and magnetic disks, thumb drives, and smart cards that are inserted into a drive for transfer onto another computer readable storage medium that is also part of persistent storage 505. Process 400 can be stored in persistent storage 505 for access and/or execution by one or more of the respective processor(s) 501 via cache 503.

Communications unit 507, in these examples, provides for communications with other data processing systems or devices. In these examples, communications unit 507 includes one or more network interface cards. Communications unit 507 may provide communications through the use of either or both physical and wireless communications links. Program instructions and data (e.g., process 400) used to practice embodiments of the present invention may be downloaded to persistent storage 505 through communications unit 507.

I/O interface(s) 506 allows for input and output of data with other devices that may be connected to each computer system. For example, I/O interface(s) 506 may provide a connection to external device(s) 508, such as a keyboard, a keypad, a touch screen, and/or some other suitable input device. External device(s) 508 can also include portable computer readable storage media, such as, for example, thumb drives, portable optical or magnetic disks, and memory cards. Program instructions and data (e.g., process 400) used to practice embodiments of the present invention can be stored on such portable computer readable storage media and can be loaded onto persistent storage 505 via I/O interface(s) 506. I/O interface(s) 506 also connect to display 509.

Display 509 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A device for computing, the device comprising:
   one or more gate stacks are disposed on a fin semiconductor device;
   a first gate stack of the one or more gate stacks comprises of a first ferroelectric layer and first interfacial layer, respectively;
   a second gate stack of the one or more gate stacks comprises of a second ferroelectric layer and second interfacial layer, respectively and wherein the second ferroelectric layer contains a higher concentration of defects than the first ferroelectric layer which contributes to a leakage current, wherein the leakage current flows from the first gate stack towards the second gate stack;
   the first gate stack of the one or more gate stacks contains a first gate and the second gate stack of the one or more gate stacks contains a second gate;
   a fin is disposed between the second interfacial layer and the first interfacial layer, wherein the fin consists of a junction-less channel and the fin consists of one or more depletion layers; and
   a source terminal and a drain terminal formed on either ends of the fin, wherein a drain current flows from the source terminal towards the drain terminal.

2. The device of claim 1, wherein the semiconductor device comprises of nanosheet, planar and FET structures.

3. The device of claim 1, wherein the defects consists of oxygen vacancies.

4. The device of claim 1, wherein the first ferroelectric layer act as a dielectric for the first gate.

5. The device of claim 1, wherein the second ferroelectric layer act as a dielectric for the second gate.

6. The device of claim 1, wherein the first interfacial layer has a different thickness than the second interfacial layer by 0.5 nm to 1.0 nm.

7. The device of claim 1, wherein one or more channels is doped with either n-type or p-type and wherein concentration of doping is 1E19 $cm^{-3}$ or higher.

8. The device of claim 1, wherein thickness of the first ferroelectric layer and the second ferroelectric layer is between 2 to 10 nm.

9. The device of claim 6, wherein the first and second interfacial layers, respectively, has a thickness range between 0.5 nm to 1.5 nm and is composed of $SiO_2$.

* * * * *